United States Patent [19]
Hshieh et al.

[11] Patent Number: 5,729,037
[45] Date of Patent: Mar. 17, 1998

[54] MOSFET STRUCTURE AND FABRICATION PROCESS FOR DECREASING THRESHOLD VOLTAGE

[75] Inventors: Fwu-Iuan Hshieh, Saratoga; Yan Man Tsui, Union City; True-Lon Lin, Cupertino; Danny Chi Nim; Koon Chong So, both of San Jose, all of Calif.

[73] Assignee: MegaMOS Corporation, San Jose, Calif.

[21] Appl. No.: 638,639

[22] Filed: Apr. 26, 1996

[51] Int. Cl.$^6$ .......................... H01L 29/76; H01L 29/94; H01L 31/062; H01L 31/113
[52] U.S. Cl. .......................... 257/329; 257/334; 257/335
[58] Field of Search .................................. 257/329, 334, 257/335

[56] References Cited

U.S. PATENT DOCUMENTS 5,252,848  10/1993  Adler .......................... 257/328

*Primary Examiner*—Stephen Meier
*Attorney, Agent, or Firm*—Bo-In Lin

[57] ABSTRACT

Improved power MOSFET structure, and fabrication process are disclosed in this invention to achieve a low threshold voltage. The improved MOSFET device is formed in a semiconductor substrate with a drain region formed near a bottom surface of the substrate supporting a plurality of double-diffused vertical cells thereon wherein each of the vertical cells including a pn-junction having a body region surrounding a source region and each of the vertical cell further including a gate above the pn-junction. Each of the vertical cells further includes a source-dopant segregation reduction layer for reducing a surface segregation between the source region and an oxide layer underneath the gate whereby the body surface peak dopant concentration near an interface between the source region and the body region is reduced for reducing a threshold voltage of the MOSFET device. In another preferred embodiment, the source-dopant segregation reduction layer includes a LPCVD nitride layer formed on top of the polysilicon gates.

7 Claims, 5 Drawing Sheets

MOSFET STRUCTURE AND FABRICATION PROCESS FOR DECREASING THRESHOLD VOLTAGE

BACKGROUND OF THE INVENTION

1. Field of the Invention

This invention relates generally to the structure and fabrication process of planar power MOSFETs. More particularly, this invention relates to a novel and improved structure and process for fabricating a power MOSFET device to lower the threshold voltage.

2. Description of the Prior Art

There are technical difficulties in applying the conventional techniques to lower the threshold voltage for a power metal oxide silicon field effect transistor (MOSFET) device. Specifically, in the conventional planar structure of power MOSFETs, threshold voltage is more difficult to adjust due to the concerns of source-to-drain leakage current which is caused by a shorter channel length when the polysilicon space is reduced to achieve higher cell density by shrinking unit cell areas. Particularly, in a power MOSFET transistor with shallow body junction, the source-to-drain leakage current is often exacerbated by the more pronounced problems of punch-through caused by the shallow junction and shorter channel length. These technical difficulties are encountered by all types of planar MOSFET cellular structures such as square, circular, and hexagonal topologies.

The practical usefulness, functionality and effectiveness of the MOSFETs are greatly limited by the difficulty when the threshold voltage of a power MOSFET transistor cannot be further reduced. Particularly, power MOSFET transistors are being applied in portable electronic devices to provide power from the batteries. The threshold voltage of the MOSFET transistor is a critical determining factor in dictating the length of time that a portable electronic device can be continuously sustained and operated with the power supplied from the battery. A lower MOSFET threshold voltage is greatly desired because a lower MOSFET threshold voltage can prolong the operational duration of the electronic device powered by batteries. The demands for lower threshold MOSFETs are even more increased because of the fact that, benefited by the technological advancements and miniaturization, more and more electronic devices are becoming portable and are now powered by batteries.

In U.S. Pat. No. 5,248,627 entitled 'Threshold Adjustment in Fabricating Vertical DMOS Devices' (issued on Sep. 28, 1993), Williams discloses a process for fabricating a p-channel VDMOS transistor includes a high temperature long diffusion step subsequent to deposition of the polysilicon gate for forming body regions. The threshold voltage of the VDMOS device is adjusted subsequent to both gate formation and the high temperature long duration of body diffusion by implanting a suitable p-type dopant into the VDMOS channel through the insulated gate after formation of the gate. Since the gate is formed before the threshold adjust, high temperature processing and long duration diffusions requiring the presence of the gate may be completed prior to threshold adjust without risk to the adjusted device threshold.

The process of fabricating a p-channel VDMOS, as disclosed by Williams, is a method to lower the threshold voltage of a p-channel DMOS with high energy blank implant of boron through the poly gate after N-body diffusion. This method requires that the poly gate has high level of uniformity. It further has the problems that blank boron implantation over the whole poly gate may create a shorter channel with low body surface concentration which will lead to a high leakage current between drain and source. Additionally, a high energy implanter has to be applied. This requirement becomes even more demanding when a $N^+$ poly gate is used due to heavier boron ions, implanted by high energy implanter (>300 Kev), is required to compensate high work function difference between $N^+$ poly and substrate for achieving low threshold voltage. Furthermore, the doping concentration of the JFET area near the poly gate between two n-body regions is reduced due to the blank boron implant which also causes another undesirable side effect of causing the on-resistance to increase.

For a p-channel power MOSFET transistor of which the channels are formed with double diffusion techniques (DMOS), it appears that the threshold voltage is adversely affected by a boron segregation phenomena which often occurs at the interface of the $P^+$ source and the gate oxide. FIG. 1 shows a boron segregation by illustrating a cross section of a regular p-channel MOSFET. The power MOSFET transistor as shown is a typical vertical double diffused MOS (VDMOS) device which uses a double diffusion technique to control the channel length 1. Two successive diffusions are performed through the same window etched in the oxide layer with first a n-diffusion using either arsenic or phosphorous to form the n-body regions, then a p diffusion using boron, to produce two closely spaced pn junctions at different depths below the silicon surface. The difference in the lateral diffusion between the N-body and the p+ source region defines the surface channel region. With this pn junction, as shown in FIG. 1, the VDMOS supports the drain voltage vertically in the $p^-$ epilayer. The p-channel is formed in the n-type "body" region when a sufficient negative voltage is applied. The current flows laterally from the source through the channel, parallel to the surface of the silicon. The current flow then turns through a right angle to flow vertically down through the drain epilayer to the substrate and to the drain contact.

During the second diffusion operation, the boron ions at the interface between the silicon and the silicon oxide, have a natural tendency to migrate to the silicon oxide rather than staying in the silicon region. Instead of extending to the full diffusion length, due to migration of the boron ions to the silicon oxide on the top surface, the surface lateral length of the p+ source region becomes shorter. The surface N-body concentration becomes less compensated which causes a higher N-body peak concentration near the surface when the manufacture processes are completed.

Even in a regular MOSFET transistor, the performance characteristics including the channel length can usually be controlled through the processing steps. For example, by adjusting the relative doping concentrations in the diffused p-channel region and the $n^-$ layer, the depletion layer which supports $V_{DS}$, a drain to source voltage, are controlled to extend down into the epilayer rather than laterally into the channel. However, due to the boron segregation, and the limitations of leakage currents caused by the shallow junctions and short channel lengths as described above, lower threshold voltage are not yet achieved by those of ordinary skill in the art through adjustments of the device structure and processing steps.

Therefore, there is still a need in the art of power device fabrication, particularly for power MOSFET design and fabrication, to provide a structure and fabrication process that would resolve these limitations.

SUMMARY OF THE PRESENT INVENTION

It is therefore an object of the present invention to provide an improved MOSFET structure, and fabrication process to overcome the aforementioned limitations encountered in the prior art.

Specifically, it is an object of the present invention to provide an improved MOSFET structure and fabrication process wherein a lower threshold voltage can be achieved by reducing the source-dopant segregation phenomenon, particularly a boron segregation, for a p-channel MOSFET.

Another object of the present invention is to provide an improved MOSFET structure and fabrication process by providing a LPCVD nitride layer after the source boron implant and prior to the deposition of PSG or BPSG layer to reduce the boron segregation such that a lower threshold voltage can be achieved for a p-channel MOSFET transistor.

Briefly, in a preferred embodiment, the present invention includes a MOSFET device formed in a semiconductor substrate with a drain region formed near a bottom surface of the substrate supporting a plurality of double-diffused vertical cells thereon wherein each of the vertical cells including a pn-junction having a body region surrounding a source region and each of the vertical cell further including a gate near the pn-junction. Each of the vertical cells further includes a source-dopant segregation reduction means for reducing a surface segregation of source dopants between silicon and gate oxide especially near an interface region between the source region and the body region under the gate. In a preferred embodiment, the source-dopant segregation reduction means includes an insulation layer formed on top of the gate. In another preferred embodiment, the source-dopant segregation reduction means includes a nitride layer. In yet another preferred embodiment, the source-dopant segregation reduction means includes a low pressure chemical vapor deposition (LPCVD) nitride layer. In yet another preferred embodiment, the MOSFET device is a p-channel transistor and the source is a $p^+$ source wherein the segregation reduction means is a boron segregation reduction means.

These and other objects and advantages of the present invention will no doubt become obvious to those of ordinary skill in the art after having read the following detailed description of the preferred embodiment which is illustrated in the various drawing figures.

DETAILED DESCRIPTION OF THE PREFERRED EMBODIMENT

Figure 1:
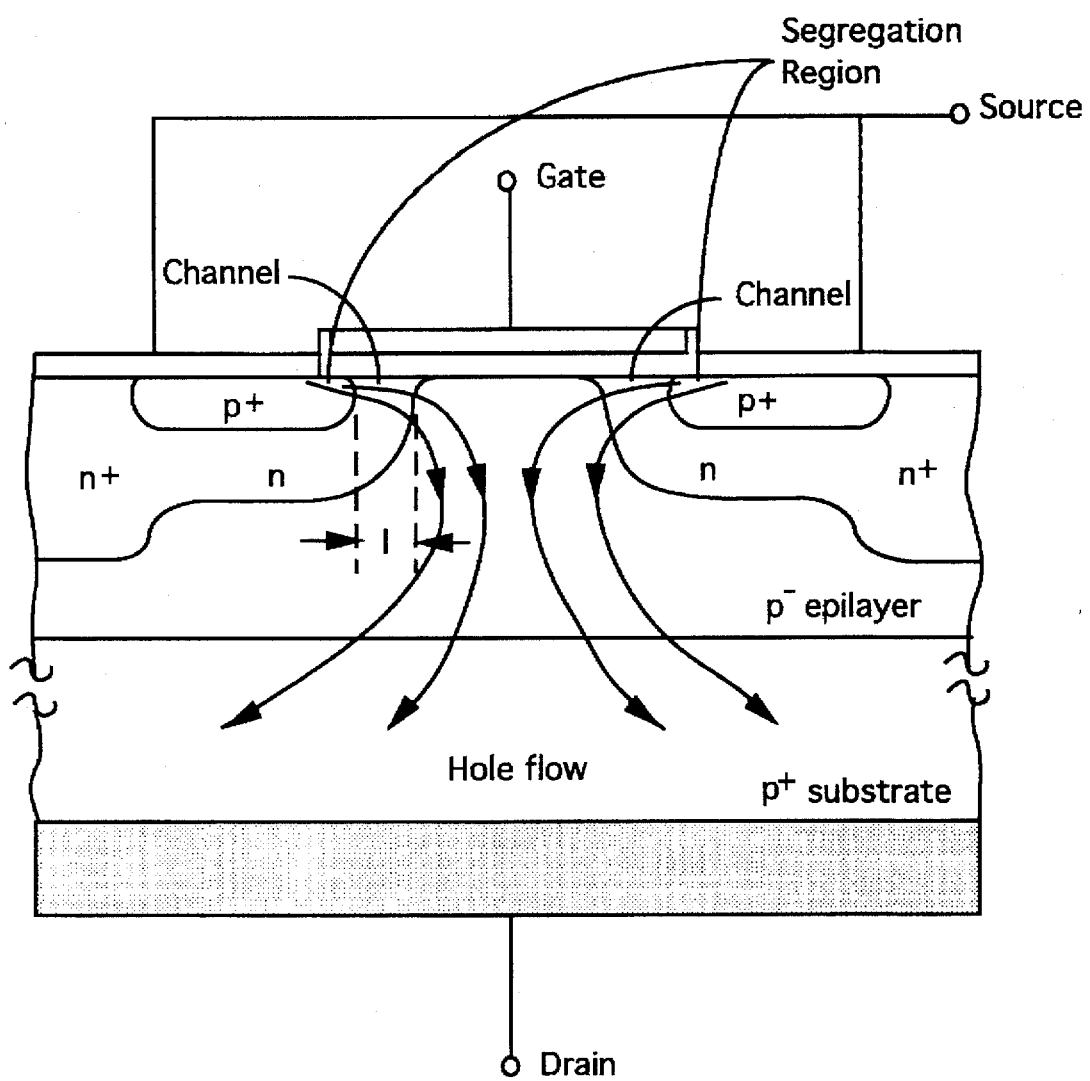
FIG. 1 is a cross-sectional view of a prior art structure of a general MOSFET.
Figure 2A:
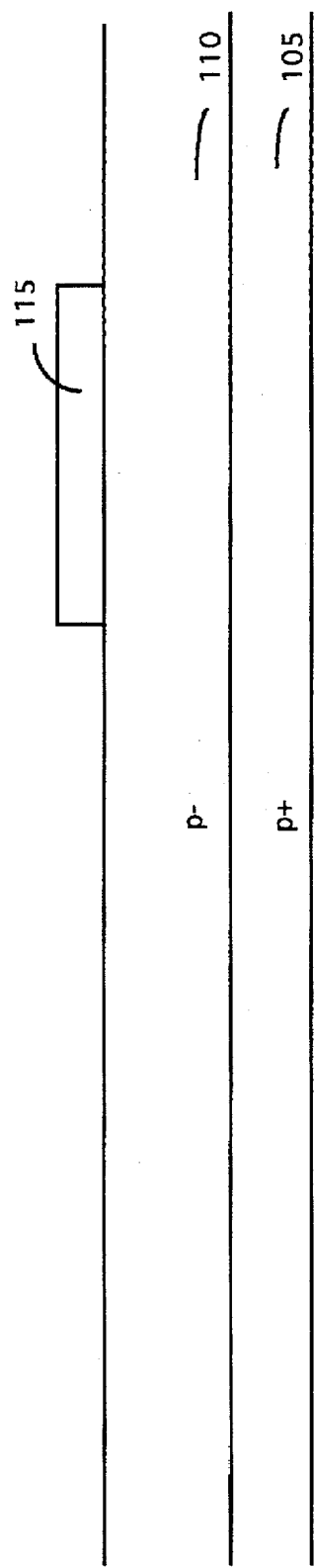
FIGS. 2A to 2D are cross sectional view showing the processing steps for manufacturing a MOSFET transistor of the present invention.

Please refer to FIGS. 2A to 2D for the processing steps for manufacturing the power MOSFET device 100 of the present invention. As shown in FIG. 2A, the processing steps begins by first growing a $p^-$ epitaxial layer 110 with a resistivity ranging from 0.1 to 50 ohm-μm on top of a $p^+$ substrate 105. The substrate has a resistivity of 0.01 to 0.02 ohm-μm. The thickness and the resistivity of the epitaxial layer 110 depend on the device requirements for the on-resistance and breakdown voltage. In a preferred embodiment, the thickness of the epilayer 110 is about six to eight microns (6–8 μm). An initial oxide layer 115 of thickness in the range of 5,000 to 10,000 Å is grown which is then etched by applying an mask to define the active areas.

Figure 2B:
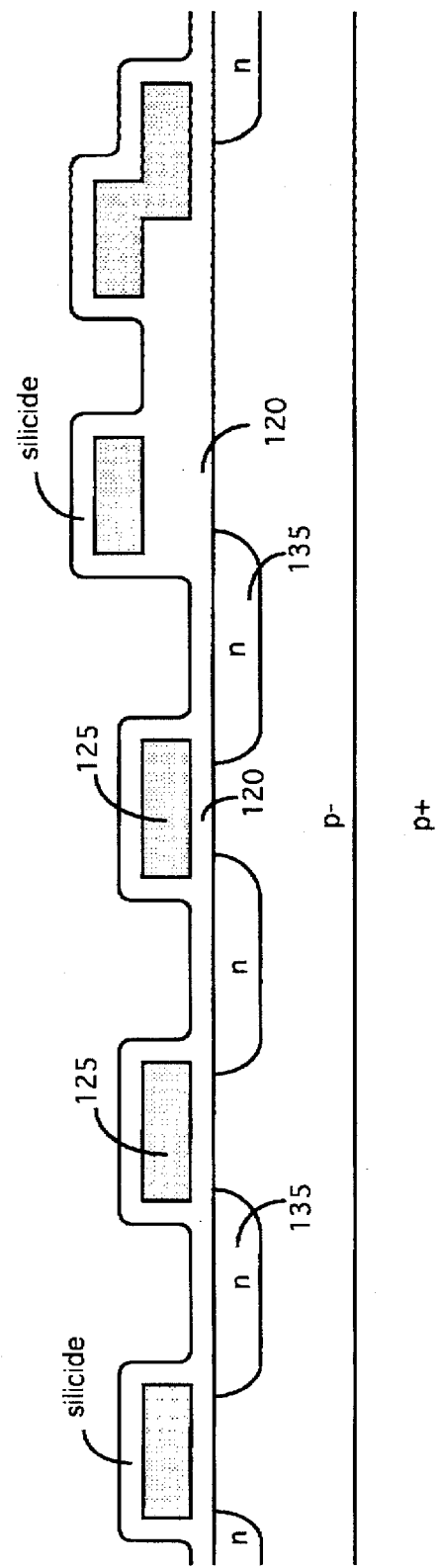

Referring to FIG. 2B, where a gate oxidation process is first carried out to form a gate oxide layer 120 of thickness ranging from 100.0–1000.0 Å. A polysilicon layer 125 of thickness ranging from 4000–8000 Å is then deposited on the gate oxide layer 120. A phosphorus-implant process with an ion beam of energy at 60–80 Kev with a flux density of 1 to $2 \times 10^{15}/cm^2$. A poly mask is then applied to carry out the an anisotropic etching process to define the poly gate 125. The resist is stripped and then perform a n-body implant by the use of phosphorus ions at 30–100 Kev with an ion beam of $1 \times 10^{13}$ to $3 \times 10^{14}/cm^2$ flux density to form the n-body region 135. A n-body diffusion process is then carried out at an elevated temperature of 1,000–1,200° C. for ten minutes to three hours to increase the depth of the n-body region 135 to 0.8–2.0μ.

Figure 2C:
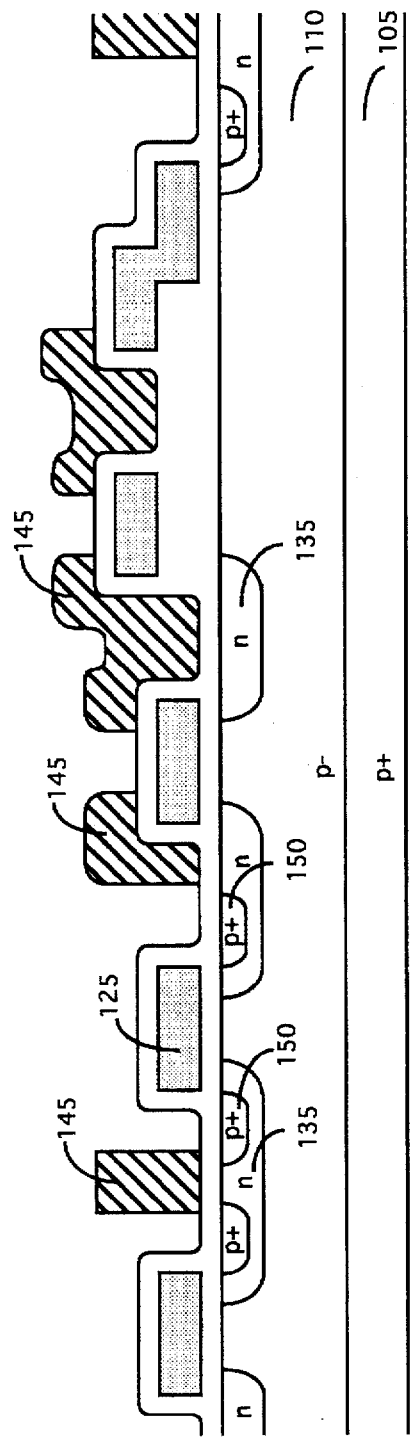
Figure 2D:
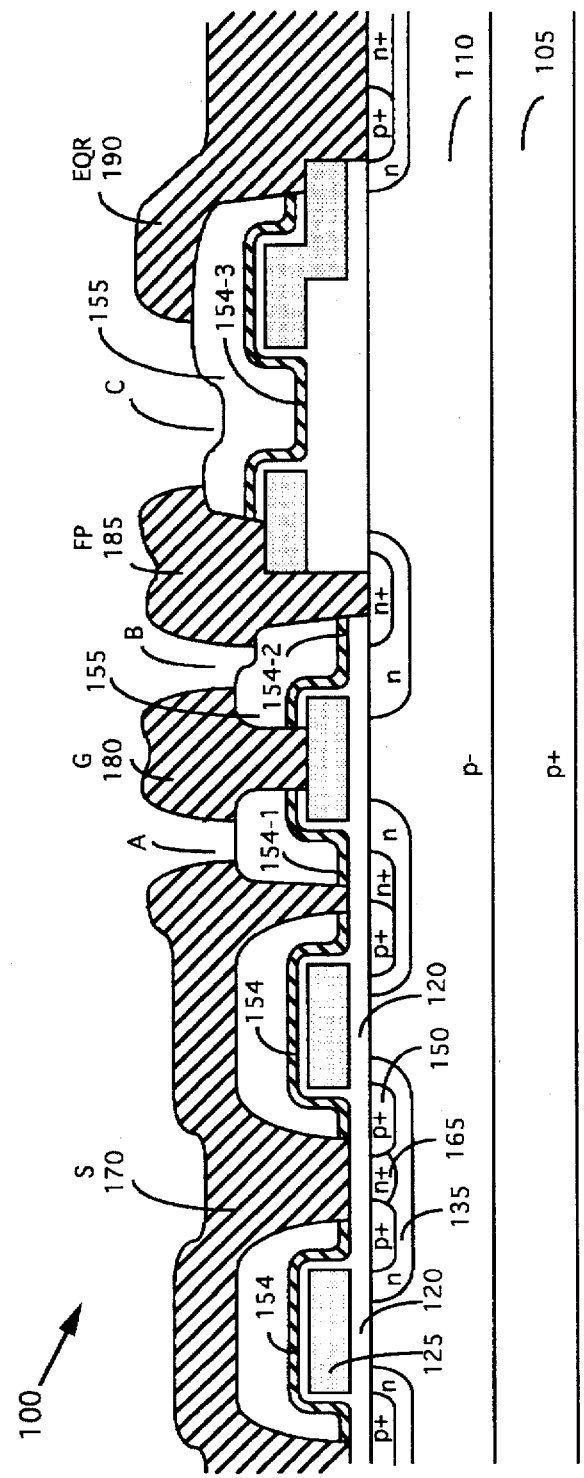

Referring to FIG. 2C, a $P^+$ block mask 145 is applied to carry out an $P^+$ implant to form the $P^+$ region 150. The $P^+$ implantation is carried out by the use of an boron or $BF_2$ ion beam at an energy of 20–100 Kev and ion flux density of $5 \times 10^{15}$ to $1 \times 10^{16}/cm^2$. After the resist, i.e., the $P^+$ blocking mask 145, is stripped. Referring to FIG. 2D, a low pressure chemical vapor deposition (LPCVD) nitride is first carried out to form a nitride layer 154 to cover the entire surface thus without requiring a special mask. The thickness can range from 5000 to 15,000 Å. A BPSG or PSG is deposited to form a layer 155 of approximately 5000–15,000 Å in thickness. A BPSG flow or PSG densification process is performed at 800°–1000° C. for thirty minutes to one hour. During this high temperature process, the $p^+$ source regions are also driven, by diffusion at an elevated temperature, into greater depth. A contact mask is applied to perform an etching process to define the contacts. A $N^+$ ion implantation is carried out to form the $N^+$ region 165 by a $N^+$ activation process at 900°–950° C. in an oxidation or inert gas ambient. The final power MOSFET device 100 is completed with the metal deposition to form the metal layer of approximately 2.0 to 4.0 μm. A metal etching with a metal mask is carried out to define the source electrode 170, the gate electrode 180, the field plate 185, and equal potential ring (EQR) 190.

Figure 3:
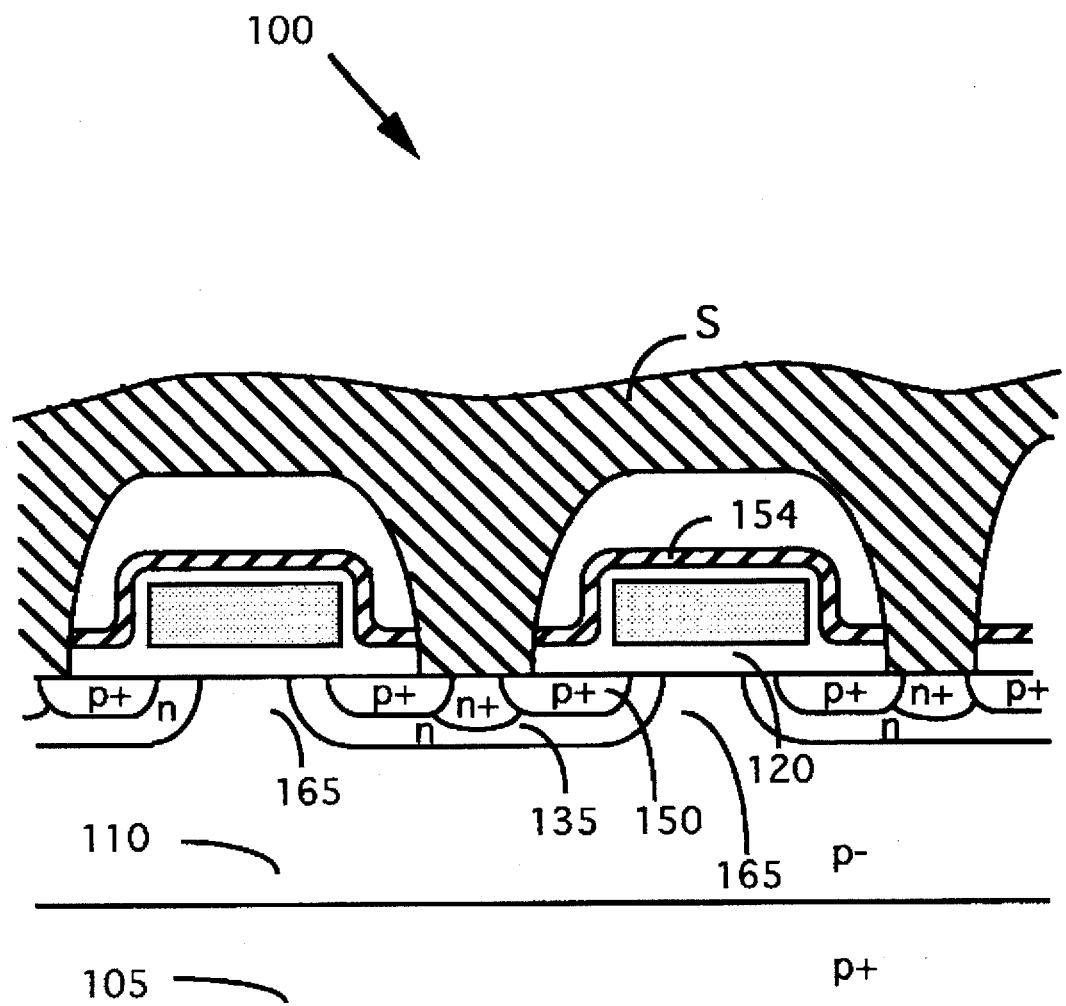
FIG. 3 shows a cross sectional view of a MOSFET transistor manufactured by applying the processing steps shown in FIGS. 2A to 2D.

FIG. 3 shows a cross sectional view of the preferred embodiment of a p-channel power MOSFET device 100 manufactured by the processing steps shown in FIGS. 2A to 2D. The device 100 is supported on a p+ substrate 105 with an p- doped epitaxial drain region 110. A plurality of n-body regions 135 and p+ source regions 150 are formed on top of the drain regions 110. A plurality of polysilicon gates 125 each insulated by a layer of gate oxide 120 are formed on the top surface of the semiconductor chip supported by the substrate 105. As shown in FIG. 3, a nitride layer 154 is specially formed to cover gate surfaces. The LPCVD nitride layer 154 which is formed after the boron source implant into the source regions 150 has the beneficial effect of reducing the segregation effect at the p-source 150 and gate oxide 120 interface during the high temperature process. Since the increase of the boron concentration near the p+ source region 150 and the gate oxide 120 interface is less than 1000Å in thickness, a punch through problem between the drain and source would not occur.

Figure 4A:
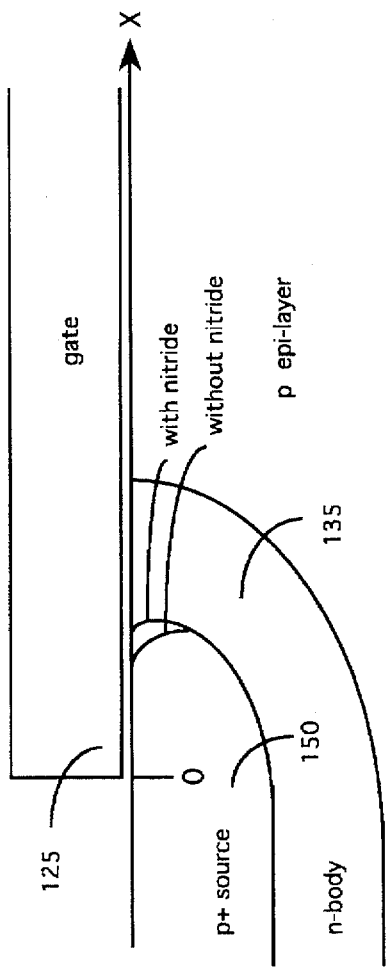
FIGS. 4A and 4B is a cross sectional view and a variation of dopant concentration curves respective of a MOSFET device of the present invention wherein the reasons for reducing the threshold voltage for a MOSFET device of the present invention are described.
Figure 4B:
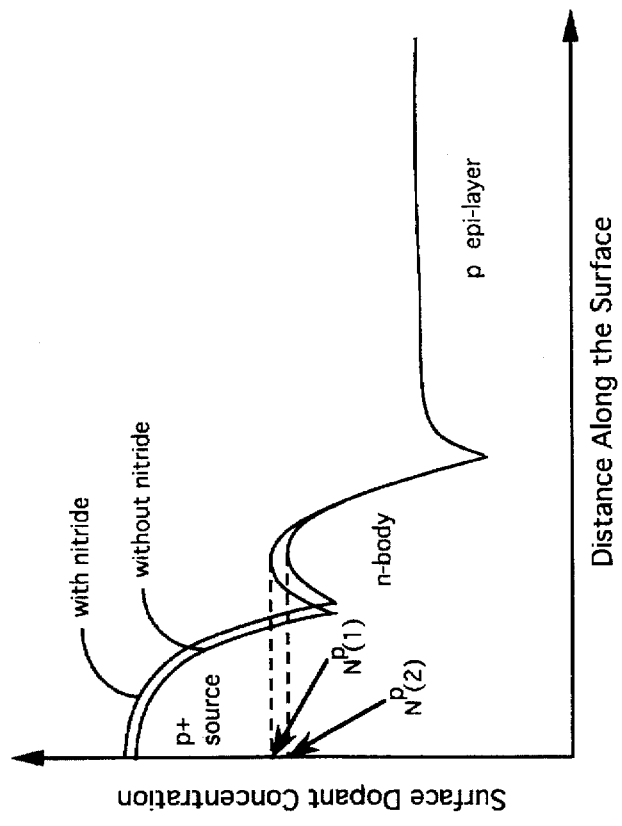

Please refer to FIGS. 4A and 4B for the explanation of the reasons that the threshold voltage is improved by implementing this special body-dopant segregation reduction layer, e.g., boron ion segregation reduction LPCVD nitride layer 154. In FIG. 4B, the dopant concentration along the surface underneath the gate oxide 120 is plotted in a Cartesian coordinate system where the abscissa, i.e., the x-axis, represents the distance from the point-0 beginning from the edge of the gate 125 as that shown in FIG. 4A. Two curves are shown in FIG. 4B for comparison between the solid line represents the variation of dopant concentration for the device with the LPCVD nitride layer 154 while the dotted line representing the variation of the dopant concentration for a device without the LPCVD nitride layer 154 along X-axis. As the threshold voltage is a function of the peak $n^+$ source concentration along the interface surface, i.e., the surface peak body dopant concentration, represented by $N^P$, i.e., $V_{threshold}=F(N^P)$, where the higher the value of $N^P$ the higher the threshold voltage $V_{threshold}$. Because of the fact that the LPCVD nitride layer 154 reduces the boron segregation for a P-channel MOSFET, the variation of the dopant concentration along X-axis as that shown in FIG. 4B, produces a lower peak $N^+$ body concentration $N^P(1)$ when compared to the peak $N^+$ body dopant concentration $N^P(2)$ without the LPCVD nitride layer. For that reason, a lower threshold voltage is achieved by the use of a source-dopant segregation reduction layer to reduce the source-dopant segregation thus producing a lower surface peak body dopant concentration near the interface of the source and the body regions as that shown in FIGS. 4A and 4B.

In summary, the present invention discloses a MOSFET device 100 formed in a semiconductor substrate 105 with a drain region formed near a bottom surface of the substrate 105 supporting a plurality of double-diffused vertical cells thereon wherein each of the vertical cells including a pn-junction having a body region 135 surrounding a source region 150 and each of the vertical cell further including a gate 125 near the pn-junction. Each of the vertical cells further includes a source-dopant segregation reduction means 154 for reducing a surface segregation between the source region 150 and the gate oxide 120 underneath the gate 125 such that the surface peak body dopant concentration near the interface of the source and the body regions can be reduced indirectly. In a preferred embodiment, the source-dopant segregation reduction means 154 includes an insulation layer 154 formed on top of the gate. In another preferred embodiment, the source-dopant segregation reduction means includes a nitride layer 154. In yet another preferred embodiment, the source-dopant segregation reduction means includes a low pressure chemical vapor deposition (LPCVD) nitride layer 154. In yet another preferred embodiment, the MOSFET device 100 is a p-channel transistor and the source 150 is a $p^+$ source wherein the segregation reduction means is a boron segregation reduction means 154.

A method for fabricating a MOSFET transistor on a substrate 105 is also disclosed in this invention. The method includes the steps of (a) forming an epi-layer 110 of a first conductivity type as a drain region on the substrate and forming an initial oxide layer 115 and then forming a gate oxide layer 120 thereon followed by depositing an overlaying polysilicon layer 125; (b) applying a poly mask for etching the polysilicon layer to define a plurality of poly gates 125; (c) carrying out a body implant of a second conductivity type followed by performing a body diffusion for forming a plurality of body regions 135; (d) applying a source blocking mask for implanting a plurality of source regions 150 in the body regions with the first conductivity type followed by removing the source blocking mask 145; (e) forming a source-dopant segregation reduction layer including a LPCVD nitride layer 154 on top of the MOSFET 100 followed by forming an insulation layer 155 thereon followed by a densification process at an elevated temperature; (f) applying a contact mask for opening a plurality of contacts for providing contact to the source regions, gate regions, guard rings and channel stop followed by depositing a contact metal layer thereon; and (g) applying a metal mask for etching and defining the source electrode, gate electrode and equal ring electrode. In a preferred embodiment, the step (a) of forming an epi-layer of the first conductivity type is a step of forming the epi-layer as a p-type epi-layer thus the MOSFET is fabricated as a p-channel MOSFET. In yet another preferred embodiment, in the step (e) the step of forming an insulating layer on top of the MOSFET is a step of forming a BPSG layer 155. In another preferred embodiment, in the step (e) the step of forming an insulating layer on top of the MOSFET is a step of forming a PSG layer. In yet another preferred embodiment, the step (c) in forming a plurality of body regions is a step of forming shallow body regions of depth approximately 0.8 to 2.0 micron-meters (0.8–2.0µ). In yet another preferred embodiment, the step (f) of applying a contact mask for opening a plurality of contacts further is followed a $n^+$ implant for forming a $n^+$ region 165 between the source regions before the step of depositing a contact metal layer thereon.

Therefore, an improved MOSFET structure, and fabrication process to overcome the limitations encountered in the prior art is provided. Specifically, in a preferred embodiment of the present invention, a source dopant segregation reduction layer is implemented to obtain a lower threshold voltage by reducing the source-dopant segregation, e.g., a boron segregation, for a p-channel MOSFET. Particularly, in a preferred embodiment of p-channel MOSFET, a LPCVD nitride layer is formed after the source boron implant and prior to the deposition of PSG or BPSG layer to reduce the boron segregation such that a lower threshold voltage can be achieved.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

We claim:

1. A vertical MOSFET cell formed in a semiconductor substrate with a drain region of a first conductivity type formed at a bottom surface of said substrate, said MOSFET cell comprising:

a gate supported on a top surface of said substrate disposed substantially in a central portion of said cell;

a source region of said first conductivity disposed in said substrate surrounding edges of said gate with an inner source portion thereof underneath said gate;

a body region of a second conductivity type disposed in said substrate encompassing said source region, supporting a vertical channel extended from said source region to said drain, said body region having an inner body portion underneath said gate and extending away from said edges of gate for defining an outer boundary of said MOSFET cell and said body region further;

an insulation layer covering said gate constituting a peak-body dopant concentration reducing means whereby a peak-body dopant concentration under said gate near an interface point between said body region and said source region is reduced relative to said peak-body-dopant concentration without said insulation layer.

2. The MOSFET cell as recited in claim 1 wherein:

said peak-body-dopant concentration reducing means is a silicon nitride layer covering said gate.

3. The MOSFET cell as recited in claim 2 wherein:

said first conductivity type is a P conductivity type and said MOSFET cell is a P-channel cell.

4. The MOSFET cell as recited in claim 3 wherein:

said first conductivity type is a N conductivity type and said MOSFET cell is a N-channel cell.

5. The MOSFET cell as recited in claim 2 wherein:

said peak-body dopant concentration reducing means includes a low pressure chemical vapor deposition (LPCVD) nitride layer.

6. The MOSFET cell as recited in claim 5 wherein:

said first conductivity type is a P conductivity type and said MOSFET cell is a P-channel cell and said source region is a boron doped region.

7. A vertical p-channel MOSFET cell formed in a semiconductor substrate with a drain region of a P-conductivity type formed at a bottom surface of said substrate, said MOSFET cell comprising:

a gate supported on a top surface of said substrate disposed substantially in a central portion of said cell;

a source region of said P-conductivity disposed in said substrate surrounding edges of said gate with an inner source portion thereof underneath said gate;

a body region of a N-conductivity type disposed in said substrate encompassing said source region with an inner body portion underneath said gate and extending away from said edges of gate for defining an outer boundary of said MOSFET cell;

a LPCVD nitride layer covering said gate constituting a peak-body dopant concentration reducing means whereby a peak-body dopant concentration under said gate near an interface point between said body region and said source region is reduced relative to said peak-body-dopant concentration without said LPCVD nitride layer.

* * * * *